United States Patent
Li et al.

(10) Patent No.: US 12,112,928 B1
(45) Date of Patent: Oct. 8, 2024

(54) PECVD APPARATUS

(71) Applicant: GUANGZHOU AIFO LIGHT COMMUNICATION TECHNOLOGY COMPANY LTD., Guangzhou (CN)

(72) Inventors: Guoqiang Li, Guangzhou (CN); Xinyan Yi, Guangzhou (CN)

(73) Assignee: GUANGZHOU AIFO LIGHT COMMUNICATION TECHNOLOGY COMPANY LTD, Guangzhou (CN)

( * ) Notice: Subject to any disclaimer, the term of this patent is extended or adjusted under 35 U.S.C. 154(b) by 0 days.

(21) Appl. No.: 18/435,545

(22) Filed: Feb. 7, 2024

(30) Foreign Application Priority Data

Sep. 15, 2023 (CN) .......................... 202311189516.0

(51) Int. Cl.
    *H01J 37/32*      (2006.01)
    *C23C 16/02*      (2006.01)
    (Continued)

(52) U.S. Cl.
CPC .... *H01J 37/32715* (2013.01); *C23C 16/0227* (2013.01); *C23C 16/4583* (2013.01); *C23C 16/50* (2013.01); *H01J 37/32743* (2013.01); *H01J 37/32899* (2013.01); *H01L 21/67028* (2013.01); *H01L 21/67034* (2013.01); *H01L 21/6704* (2013.01); *H01L 21/67196* (2013.01); *H01L 21/67706* (2013.01); *H01J 2237/2007* (2013.01); *H01J 2237/20214* (2013.01); *H01J 2237/3321* (2013.01)

(58) Field of Classification Search
None
See application file for complete search history.

(56) References Cited

U.S. PATENT DOCUMENTS

| 6,029,369 | A | 2/2000 | Gonzalez-Martin et al. |
| 2007/0020067 | A1* | 1/2007 | Lin ...................... B65G 49/064 414/811 |

(Continued)

FOREIGN PATENT DOCUMENTS

| CN | 102054910 A | 5/2011 |
| CN | 110062818 A | 7/2019 |

(Continued)

*Primary Examiner* — Karla A Moore
(74) *Attorney, Agent, or Firm* — Daniel M. Cohn; Howard M. Cohn

(57) ABSTRACT

A PECVD apparatus includes a transfer chamber, a load lock, a cleaning chamber, a spin-drying chamber, a deposition chamber, and an unload lock; wherein the load lock, the cleaning chamber, the spin-drying chamber, the deposition chamber, and the unload lock are successively spirally arranged on a side wall of the transfer chamber; and a spiral conveyor device is arranged in the transfer chamber, wherein the spiral conveyor device includes a conveyor rod, a spiral drive mechanism, and a plurality of conveyor assemblies; wherein the conveyor rod is vertically arranged in the transfer chamber, and the plurality of conveyor assemblies are spirally arranged on the conveyor rod, and wherein the spiral drive mechanism is configured to drive the conveyor rod to undergo a spiral ascending or descending movement.

8 Claims, 9 Drawing Sheets

(51) Int. Cl.
*C23C 16/458* (2006.01)
*C23C 16/50* (2006.01)
*H01L 21/67* (2006.01)
*H01L 21/677* (2006.01)

(56) References Cited

U.S. PATENT DOCUMENTS

| | | | | |
|---|---|---|---|---|
| 2007/0154298 A1* | 7/2007 | Hwang | ............. | H01L 21/67778 414/789.9 |
| 2012/0319415 A1* | 12/2012 | Furuta | ................ | B65G 49/064 294/81.5 |
| 2021/0171295 A1* | 6/2021 | Azuma | ................ | B65G 67/08 |

FOREIGN PATENT DOCUMENTS

| | | |
|---|---|---|
| CN | 114512574 A | 5/2022 |
| CN | 116313898 A | 6/2023 |

* cited by examiner

PECVD APPARATUS

CROSS-REFERENCE TO RELATED APPLICATIONS

This application is based upon and claims priority to Chinese Patent Application No. 202311189516.0, filed on Sep. 15, 2023 and entitled "PECVD APPARATUS," the disclosure of which is incorporated herein by reference in its entirety.

TECHNICAL FIELD

The present disclosure relates to the technical field of chemical vapor deposition, and in particular, relates to a plasma enhanced chemical vapor deposition (PECVD) apparatus.

BACKGROUND

PECVD is a commonly used semiconductor coating technology, which requires preparing a clean and flat substrate surface as a base for deposition. Therefore, the substrate generally needs to be cleaned and spin-dried to remove surface contaminants before being placed into a PECVD apparatus. However, during the process of placing the substrate into the PECVD apparatus upon cleaning and spin-drying, the substrate is prone to contamination by particulate matter in the environment and is subject to secondary pollution from the external environment, thereby affecting a film deposition effect.

With respect to the above mentioned technical problem, no effective solution has been yet proposed at present.

SUMMARY

The present disclosure is intended to provide a PECVD apparatus to perform cleaning, spin-drying, and deposition in the PECVD apparatus, such that secondary contamination of the substrate from the external environment is prevented.

The present disclosure provides a PECVD apparatus. The PECVD apparatus includes a transfer chamber, a load lock, a cleaning chamber, a spin-drying chamber, a deposition chamber, and an unload lock; wherein the load lock, the cleaning chamber, the spin-drying chamber, the deposition chamber, and the unload lock are successively spirally arranged on a side wall of the transfer chamber;

a spiral conveyor device is arranged in the transfer chamber, wherein the spiral conveyor device includes a conveyor rod, a spiral drive mechanism, and a plurality of conveyor assemblies;

wherein the conveyor rod is vertically arranged in the transfer chamber, and the plurality of conveyor assemblies are spirally arranged on the conveyor rod, and wherein the spiral drive mechanism is configured to drive the conveyor rod to undergo a spiral ascending or descending movement.

In the PECVD apparatus according to the present disclosure, a load lock, a cleaning chamber, a spin-drying chamber, a deposition chamber, and an unload lock are spirally arranged on a transfer chamber. With the cooperation of a spiral conveyor device, a substrate tray containing one or more substrates is successively fed to the cleaning chamber, the spin-drying chamber, the deposition chamber, and the unload lock for corresponding processing, such that substrate cleaning, spin-drying, deposition reaction, and unloading and storage processing are implemented. The entire process goes on within the apparatus, such that the problem that the deposition effect is affected due to secondary contamination to the substrate in the transfer process upon cleaning is prevented. In this way, the PECVD apparatus according to the present disclosure achieves a high preparation efficiency and a better deposition effect.

In the PECVD apparatus, a drying device is arranged in the spin-drying chamber, wherein the drying device includes a spin-drying support, and a support base, a lift mechanism, a plurality of clamp fingers, a connection rod, a rotation mechanism, and a jack mechanism;

wherein the support base is in lift connection to the spin-drying support, and is driven to ascend or descend by the lift mechanism to receive a substrate tray fed by the conveyor assemblies, wherein the plurality of clamp fingers are circumferentially arrayed on an outer side of the support base, and are hinged to the drying support, wherein a bottom of the support base is hinged to one end of each of the clamp finger via the connection rod, wherein the rotation mechanism is arranged at a bottom of the drying support, and is configured to drive the drying support to reciprocally rotate, and wherein the jack mechanism is arranged on the drying support, and is configured to jack to separate a substrate on the substrate tray.

In this example, the spin-drying device is capable of supporting the substrate tray, separating the substrates, and independently spin-dry the substrates, such that the spin-drying of the substrates is performed in an orderly manner.

In the PECVD apparatus, a clamp groove is defined in the other end of the clamp finger, wherein an elastic member is arranged on the clamp groove.

In the PECVD apparatus, a plurality of rollers are rotatably connected to the support base.

In the PECVD apparatus, a push mechanism is further arranged in the spin-drying chamber, wherein the push mechanism includes a stop plate arranged on a side of the support base to define a feed position of the substrate tray and a push rod configured to drive the stop plate to undergo a horizontal displacement.

In the PECVD apparatus, the jack mechanism includes a plurality of jack assemblies, each of the jack assemblies including a jack rod, a jack elastic member, and a press plate, wherein the press plate is secured to a bottom of the jack rod, two ends of the jack elastic member are respectively securely connected to the drying support and the press plate, and the support plate and the drying support are both provided with a jack groove slidably engageable with the jack rod.

In this example, where the substrate is initially clamped by the clamp fingers, the support base comes into contact with the press plate, the support base continues to descend to cause the clamp fingers to securely clamps the substrate and tightly press the press plate such that the jack rod follows the support base to descend. In this way, a top portion of the jack rod is separated from the substrate, and thus any wear due to contact between the jack rod and a bottom surface of the substrate during spin-drying is prevented.

In the PECVD apparatus, a spray assembly and a holder mechanism configured to hold a wafer substrate tray are arranged in the cleaning chamber.

In the PECVD apparatus, the conveyor assembly includes a conveyor support and a horizontal conveyor mechanism; wherein the conveyor support is secured to the conveyor rod, and a conveyor channel facing the transfer chamber is defined in the conveyor support; and the horizontal conveyor mechanism is mounted on the conveyor channel, and is configured to push and receive the substrate tray.

In the PECVD apparatus, a gate valve is arranged on a side of each of the load lock, the cleaning chamber, the spin-drying chamber, the deposition chamber, and the unload lock.

In the PECVD apparatus, a wafer cassette configured to store the substrate tray and a lift assembly configured to adjust a height of the wafer cassette are arranged in both the load lock and the unload lock.

As seen from the above, in the PECVD apparatus according to the present disclosure, a load lock, a cleaning chamber, a spin-drying chamber, a deposition chamber, and an unload lock are spirally arranged on a transfer chamber. With the cooperation of a spiral conveyor device, a substrate tray containing one or more substrates is successively fed to the cleaning chamber, the spin-drying chamber, the deposition chamber, and the unload lock for corresponding processing, such that substrate cleaning, spin-drying, deposition reaction, and unloading and storage processing are implemented. The entire process goes on within the apparatus, such that the problem that the deposition effect is affected due to secondary contamination to the substrate in the transfer process upon cleaning is prevented. In this way, the PECVD apparatus according to the present disclosure achieves a high preparation efficiency and a better deposition effect.

Figure 1:
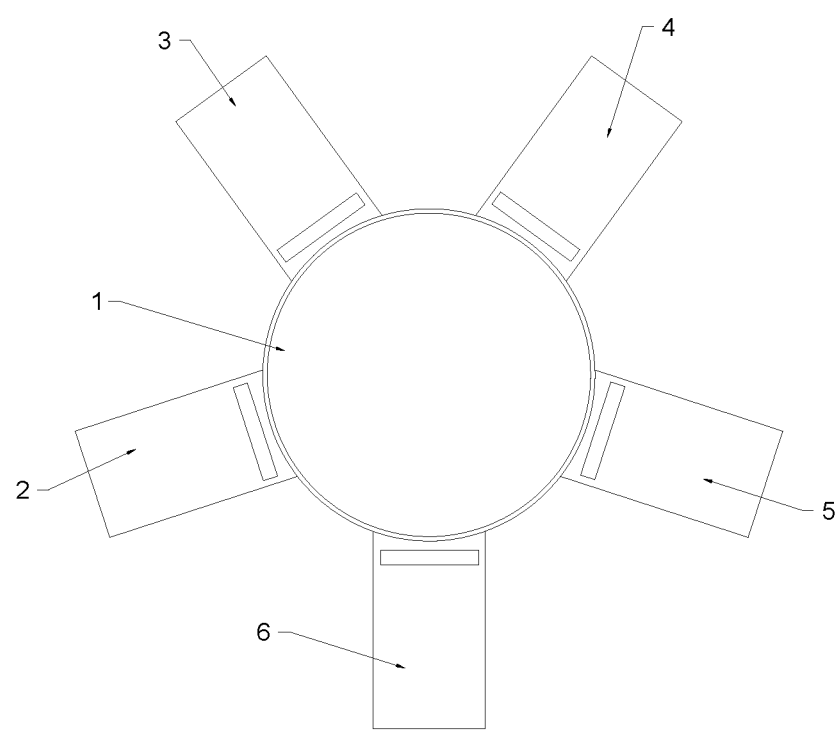
FIG. 1 is a top view of a PECVD apparatus according to some embodiments of the present disclosure.
Figure 2:
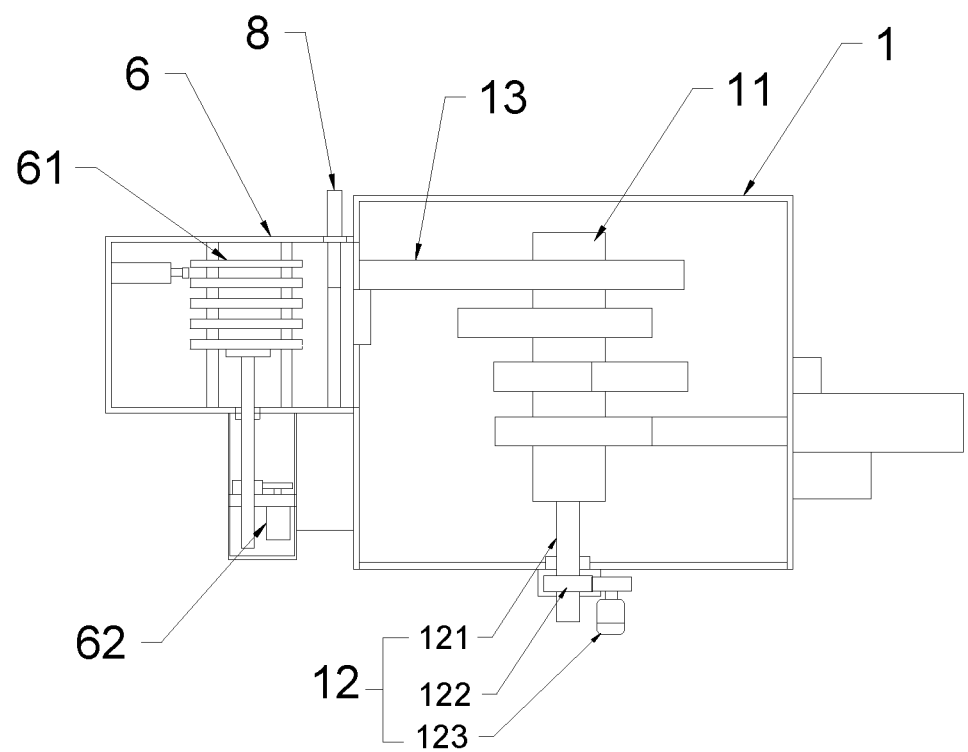
FIG. 2 is a right-side sectional view of a PECVD apparatus according to some embodiments of the present disclosure.

Reference numerals and denotations thereof: 1-transfer chamber; 2-load lock; 3-cleaning chamber; 4-spin-drying chamber; 5-deposition chamber; 6-unload lock; 7-substrate tray; 8-gate valve; 11-conveyor rod; 12-spiral drive mechanism; 13-conveyor assembly; 31-spray assembly; 32-holder mechanism; 33-liquid exhaust assembly; 41-spin-drying support; 42-support base; 43-lift mechanism; 44-clamp finger; 45-connection rod; 46-rotation mechanism; 47-jack mechanism; 48-push mechanism; 61-wafer cassette; 62-lift assembly; 71-avoidance groove; 121-screw; 122-nut; 123-rotary mechanism; 131-conveyor support; 132-horizontal conveyor mechanism; 133-guide roller; 421-roller; 441-clamp groove; 442-resilient member; 471-jack rod; 472-jack elastic member; 473-press plate; 481-stop plate; 482-push rod.

DETAILED DESCRIPTION

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present disclosure, which shall not be construed as causing limitations to the present disclosure.

In the description of some embodiments of the present disclosure, it should be understood that the terms "central," "transversal," "longitudinal," "length," "width," "thickness," "upper," "lower," "front,", "rear," "left," "right," "vertical," "horizontal," "top," "bottom," "inner," "outer," "clockwise," "counterclockwise," "axial," "radial," "circumferential," and the like indicate orientations and position relationships which are based on the illustrations in the accompanying drawings, and these terms are merely for ease and brevity of the present disclosure, instead of indicating or implying that the devices or elements shall have a particular orientation and shall be structured and operated based on the particular orientation. Accordingly, these terms shall not be construed as limiting the present disclosure. In addition, terms of "first" and "second" are only used for description, but shall not be understood as indication or implication of relative importance or implicit indication of the number of the specific technical features. Therefore, the features defined by the terms "first" and "second" may explicitly or implicitly include one or more of these features. In the description of the present disclosure, the term "multiple" or "a plurality of" signifies at least two, unless otherwise specified.

In the description of the present disclosure, it should be noted that unless otherwise specified and defined, the terms "mounted," "coupled," and "connected" and derivative forms of these words shall be understood in a broad sense, which, for example, may be understood as fixed connection, detachable connection or integral connection; may be mechanical connection or electrical connection or communicative connection; may be directly connected, indirectly connected via an intermediate medium, communication between the interiors of two elements or interactions between two elements. Persons of ordinary skill in the art may understand the specific meanings of the above terms in the present disclosure according to the actual circumstances and contexts.

In the present disclosure, unless otherwise specified or defined, by defining that a first feature is arranged "above," or "below," or "beneath" a second feature, it means that the first feature is in direct contact with the second feature, or the first feature is in indirect contact with the second feature via another feature or an intermediate medium therebetween. In addition, by defining that a first feature is arranged "over" or "above" a second feature, it means that the first feature is rightly over the second feature or is obliquely above the second feature, or the horizontal height of the first feature is greater than that of the second feature. In addition, by defining that a first feature is arranged "under," or "blow," or "beneath" a second feature, it means that the first feature is rightly under the second feature or is obliquely below the second feature, or the horizontal height of the first feature is less than that of the second feature.

Disclosure hereinafter provides many different embodiments or examples to practice different structures of the present disclosure. For simplification of the disclosure of the present application, parts and settings in specific examples are described hereinafter. Nevertheless, these examples are only intended to illustrate the present disclosure, instead of limiting the present disclosure. In addition, the reference numerals and/or reference letters may be repeated in different examples in the present disclosure. Such repetitions are intended to achieve simplification and clarity, and do not denote a relationship between the discussed embodiments and/or settings. Further, the present disclosure provides examples of various specific processes and materials. However, persons of ordinary skill in the art would note that other processes and/or other materials are also applicable.

In one aspect, referring to FIG. 1 to FIG. 9, some embodiments of the present disclosure provide a PECVD apparatus. The PECVD apparatus includes a transfer chamber 1, a load lock 2, a cleaning chamber 3, a spin-drying chamber 4, a deposition chamber 5, and an unload lock 6.

The load lock 2, the cleaning chamber 3, the spin-drying chamber 4, the deposition chamber 5, and the unload lock 6 are successively spirally arranged on a side wall of the transfer chamber 1.

A spiral conveyor device is arranged in the transfer chamber 1, wherein the spiral conveyor device includes a conveyor rod 11, a spiral drive mechanism 12, and a plurality of conveyor assemblies 13.

The conveyor rod 11 is vertically arranged in the transfer chamber 1, and the plurality of conveyor assemblies 13 are spirally arranged on the conveyor rod 11.

The spiral drive mechanism 12 is configured to drive the conveyor rod 11 to undergo a spiral ascending or descending movement.

Specifically, PECVD refers to plasma-enhanced chemical vapor deposition. In the PECVD apparatus according to the embodiments of the present disclosure, a load lock 2, a cleaning chamber 3, a spin-drying chamber 4, a deposition chamber 5, and an unload lock 6 are integrally mounted on a transfer chamber 1. The load lock 2 is configured to store an unprocessed workpiece (that is, substrate). The unload lock 6 is configured to store a processed workpiece. The cleaning chamber 3 is configured to perform upper surface cleaning for the workpiece prior to deposition. The spin-drying chamber 4 is configured to spin-dry the workpiece upon completion of cleaning. The deposition chamber 5 is configured to perform chemical vapor deposition for the workpiece upon spin-drying. In the embodiments of the present disclosure, the substrate needs to undergo plurality of processes within the same apparatus, and in the transfer chamber 1, a conventional robotic arm is replaced by a spiral conveyor device. Therefore, the workpiece is preferably a substrate supported by a substrate tray 7, that is, the PECVD apparatus according to the present disclosure transfers the workpiece by transporting the substrate tray carrying the substrate.

More specifically, the spiral drive mechanism 12 drives the conveyor rod 11 to undergo a spiral ascending or descending movement, such that the conveyor assemblies 13 are connected to the corresponding load lock 2 or the cleaning chamber 3 or the spin-drying chamber 4 or the deposition chamber 5 or the unload lock 6.

More specifically, the load lock 2, the cleaning chamber 3, the spin-drying chamber 4, the deposition chamber 5, and the unload lock 6 are arranged on a side wall of the transfer chamber 1 along one spiral line, and are preferably distributed from bottom to top spirally; and the plurality of conveyor assemblies 13 are arranged on the surface of the conveyor rod 11 along another spiral line. Connection ends of the load lock 2, the cleaning chamber 3, the spin-drying chamber 4, the deposition chamber 5, and the unload lock 6 are equidistantly arranged, and connection portions of the plurality of conveyor assemblies 13 on the conveyor rod 11 are also equidistantly arranged, such that when any one of the conveyor assemblies 13 is in a mating connection to any one of the upper sheet chamber 2, the cleaning chamber 3, the spin-drying chamber 4, the deposition chamber 5, and the unload lock 6, the other conveyor assemblies 13 also have a cavity in a mating connection thereto.

The working principles of the PECVD apparatus according to the embodiments of the present disclosure are as follows: The conveyor rod 11 achieves spiral ascending or descending under the driving action of the spiral drive mechanism 12, and shifts chambers connected to the conveyor assemblies 13 thereon, such that the same conveyor assembly 13 is at least shiftable between paired connection states with two chambers; in the embodiments of the present disclosure, the conveyor rod 11 spirally reciprocally ascends or descends based on a single fixed stroke, such that the conveyor assemblies 13 are repeatedly shifted in paired connection states with two chambers for fetching and feeding for the substrate trays 7 in different chambers, wherein the conveyor assemblies 13 perform fetching upon spiral descending of the conveyor rod 11, i.e., taking out the substrate trays 7 from the corresponding chambers, and the conveyor assemblies 13 perform feeding upon spiral ascending of the conveyor rod 11, i.e., placing the substrate trays 7 into the corresponding chambers. Thus, in spiral ascending and descending of the conveyor rod 11 of the PECVD apparatus according to the embodiments of the present disclosure, each of the substrate trays 7 is lifted upwards step by step, such that the substrates in the substrate trays 7 are successively subjected to cleaning, spin-drying, deposition reaction, and unload and storage. Accordingly, the embodiments achieve cleaning, spin-drying, and deposition-continuous processing of substrates in a single apparatus.

More specifically, the number of conveyor assemblies 13 is four or five, preferably four, and the objects in the load lock 2, the cleaning chamber 3, the spin-drying chamber 4, the deposition chamber 5, and the unload lock 6 to be subjected to fetching are the load lock 2, the cleaning chamber 3, the spin-drying chamber 4, and the deposition chamber 5, and the objects in the load lock 2, the cleaning chamber 3, the spin-drying chamber 4, the deposition chamber 5, and the unload lock 6 to be subjected to material feeding are the cleaning chamber 3, the spin-drying chamber 4, the deposition chamber 5 and the unload lock 6; therefore, configuring four conveyor assemblies 13 satisfies the need of continuous conveying of the apparatus.

More specifically, prior spiral ascending of a transfer column, it should be ensured that all the conveyor assemblies 13 have completed fetching; and prior to spiral descending of the transfer column, it should be ensured that all the conveyor assemblies 13 have completed material, and the transfer column should ensure that each transfer module 13 has completed feeding.

In the PECVD apparatus according to the embodiments of the present disclosure, the load lock 2, the cleaning chamber 3, the spin-drying chamber 4, the deposition chamber 5, and the unload lock 6 are spirally arranged on the transfer chamber 1. With the cooperation of the spiral conveyor device, the substrate tray 7 containing one or more substrates is successively fed to the cleaning chamber 3, the spin-drying chamber 4, the deposition chamber 5, and the unload lock 6 for corresponding processing, such that substrate cleaning, spin-drying, deposition reaction, and unloading and storage processing are implemented. The entire process goes on within the apparatus, such that the problem that the deposition effect is affected due to secondary contamination to the substrate in the transfer process upon cleaning is prevented. In this way, the PECVD apparatus according to the present disclosure achieves a high preparation efficiency and a better deposition effect. More specifically, the deposition chamber 5 is a chamber configured to perform a PECVD process on a substrate, which contains a device architecture conventionally required for performing PECVD. The details of such device architecture are not described herein any further.

More specifically, the PECVD apparatus according to the embodiments of the present disclosure is equipped with a vacuum assembly configured to adjust a degree of vacuum and a gas composition of each of the chambers inside the apparatus. Conventional vacuum assemblies may be employed, and details about such assemblies are not described therein any further.

In some exemplary embodiments, the spin-drying chamber 4 is provided with a spin-drying device. The spin-drying device includes: a spin-drying support 41, a support base 42, a lift mechanism 43, a plurality of clamp fingers 44, a connection rod 45, a rotation mechanism 46, and a jack mechanism 47.

The support base 42 is in lift connection to the spin-drying support 41, and is driven to ascend or descend by the lift mechanism 43 to receive a substrate tray 7 fed by the conveyor assemblies 13.

The plurality of clamping fingers 44 are distributed in a circumferential array on an outer side of the support base 42, and are hinged to the spin-drying support 41.

A bottom of the support base 42 is hinged to one end of each of the clamping fingers 44 via a connection rod 45.

A rotation mechanism 46 is arranged at a bottom of the spin-drying support 41 for driving the spin-drying support 41 to reciprocate and rotate.

A jack mechanism 47 is arranged on the support base 42 of the spin-drying support 41 for jacking and separating the substrate on the substrate tray 7.

Specifically, the support base 42 is configured to receive the substrate tray 7 fed by the conveyor assemblies 13. Where the substrate tray 7 is conveyed into position, the lift mechanism 43 drives the support base 42 to descend, and at the same time, the jack mechanism 47 jacks the substrate on the substrate tray 7 during descending of the support base 42 such that the substrate is separated from the substrate tray 7, and the clamp fingers 44 swing towards an upper side of the support base 42 under action of descending of the support base 42 and swinging of the connection rod 45 before abutting against an edge of the substrate, such that the plurality of clamping fingers 44 cooperate to secure the substrate. Upon completion of separation and securing of the substrate, the rotation mechanism 46 drives the spin-drying support 41 to reciprocally rotate, i.e., using the clamp fingers 44 to drive the substrate to rotate to spin the liquid thereon outwards, so as to complete the spin-drying treatment. Upon spin-drying, the action of each component is reset to place the spun-dried substrate on the substrate tray 7, and wait for the conveyor assemblies13 for fetching.

More specifically, the spin-drying device is capable of supporting the substrate tray 7, separating the substrates, and independently spin-dry the substrates, such that the spin-drying of the substrates is performed in an orderly manner.

More specifically, the clamp fingers 44 are circumferentially arrayed about a rotational axis of the spin-drying support 41.

More specifically, the rotation mechanism 46 may be an electrically driven pulley assembly and an electrically driven gear assembly mounted within the spin chamber 4.

In some exemplary embodiments, a clamp groove 441 is arranged is the other end of each of the clamp fingers, and a resilient member 442 is arranged in the clamp groove 441.

Specifically, the clamp groove 441 is configured to clamp the substrate, and the resilient member 442 arranged in the clamp groove 441 prevents the situation where the clamp fingers 44 exert an excessive clamp force on the substrate to crush the substrate due to an excessive descending stroke of the support base 42.

More specifically, the resilient member 442 is preferably a rubber pad.

In some exemplary embodiments, a plurality of rollers 421 are rotatably connected to the support base 42.

Specifically, the rollers 421 are arranged to facilitate the spin-drying chamber 4 to receive and send out the substrate tray 7, and the rollers 421 are employed to support the substrate tray 7 with the substrates separated therefrom. In addition, the rollers 421 are also arranged to avoid the situation where a height of the substrate tray 7 is affected due to wear on the bottom of the substrate tray 7 and consequently the processing accuracy of the subsequent deposition process is affected.

In some exemplary embodiments, a heating assembly (not illustrated in the drawings), preferably a hot wire heating assembly, is arranged within each of the rollers 421.

Specifically, the spin-drying treatment is to clear liquid and impurities carried by the liquid on an upper surface of the substrate, so as to prevent the liquid and the impurities carried by the liquid from remaining on the upper surface of the substrate and affecting the deposition treatment, and then affecting the coating uniformity of the deposition treatment. However, upon the cleaning treatment and during the spin-drying treatment, liquids may also remain on the substrate tray 7, and these remaining liquids may affect the placement flatness of the substrate and the placement flatness of the substrate, and then affect the coating uniformity of the deposition treatment. Therefore, in the embodiments of the present disclosure, the heating assembly is arranged in each of the rollers 421 for temporarily holding the substrate tray 7, so as to heat the substrate tray 7 when the substrate is separated from the substrate tray 7. By heating, the liquids on the upper surface thereof are evaporated and the liquids are prevented from affecting the placement state of the substrate.

In some exemplary embodiments, a push mechanism 48 is further arranged in the spin-drying chamber 4. The push mechanism 48 includes a stop plate 481 arranged on a side of the support base 42 to define a feed position of the substrate tray 7 and a push rod 482 configured to drive the stop plate 481 to undergo a horizontal displacement.

Specifically, the stop plate 481 is arranged on a side, away from the transfer chamber 1, of the support base 42, and is configured to define the feed position of the substrate tray 7, i.e., for positioning the substrate tray 7, and also configured to push the substrate tray 7 into the conveyor assemblies 13 under a drive action of the push rod 482 upon completion of the spin-drying process, so as to complete fetching by the conveyor assemblies 13.

More specifically, the push rod 482 is one of an air cylinder, an electric rod, or a hydraulic cylinder.

In some exemplary embodiments, the jack mechanism 47 includes a plurality of jack assemblies. Each of the jack assemblies includes a jack rod 471, a jack elastic member 472, and a press plate 473. The press plate 473 is secured to a bottom of the jack rod 471. Two ends of the jack elastic member 472 are securely connected to the spin-drying support 41 and the press plate 473, respectively. Both the support base 42 and the spin-drying support 41 are provided a jack groove slidably engageable with the jack rod 471.

Specifically, in an early stage of descending of the support base 42, the support base 42 is not yet in contact with the press plate 473, and the jack rods 471 remain different, such that the jack rods 471 undergo an ascending movement relative to the support base 42 to run through the jack groove and protrude from the support base 42 to jack the substrate on the substrate tray 7, thereby achieving the separation of the substrate from the substrate tray 7. Where the clamp fingers 44 initially clamp the substrate (the edge of the substrate begins to enter the clamp grooves 441 or comes into contact with the resilient member 442), a bottom surface of the support base 42 comes in contact with the press plate 473. Then, continuous descending of the support base 42 causes the clamp fingers 44 to clamp the substrate and compress the press plate 473, such that the jack rods 471 follow the descending of the support base 42. In this way, top portions of the jack rods are separated from the substrate, and thus wear caused by contact between the jack rods 71 and the bottom surface of the substrate during spin-drying is prevented.

More specifically, the jack elastic member 472 is preferably a compression spring.

Figure 3:
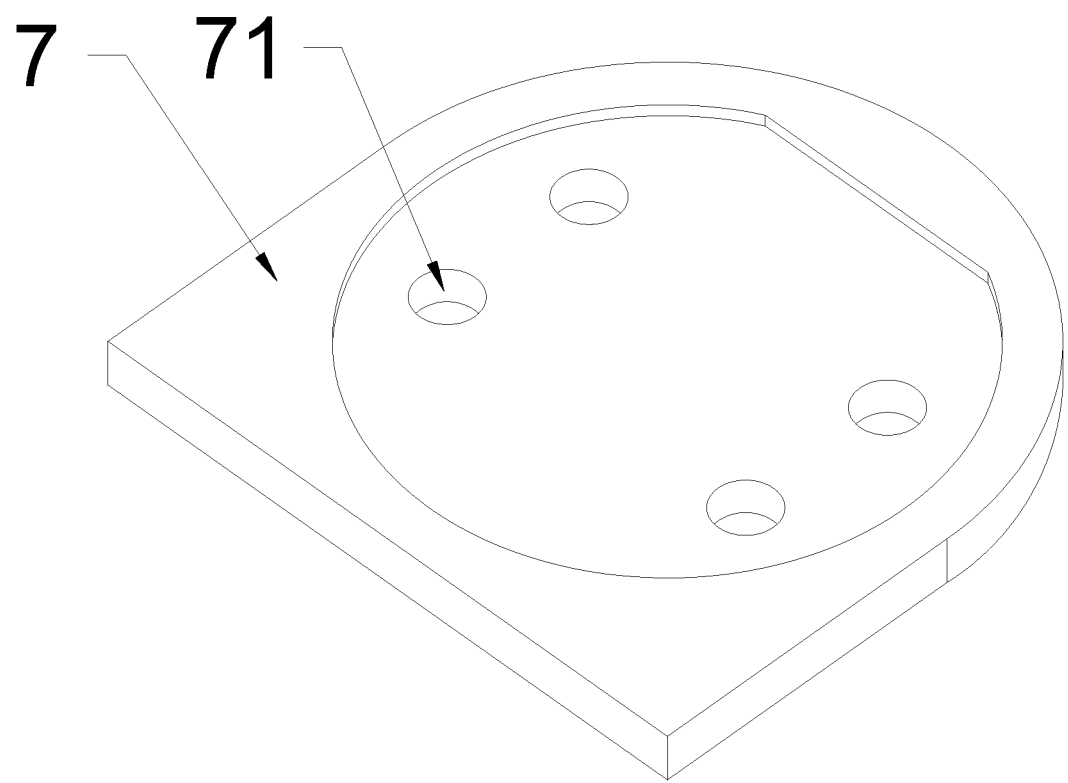
FIG. 3 is a schematic structural diagram of a substrate tray.
Figure 4:
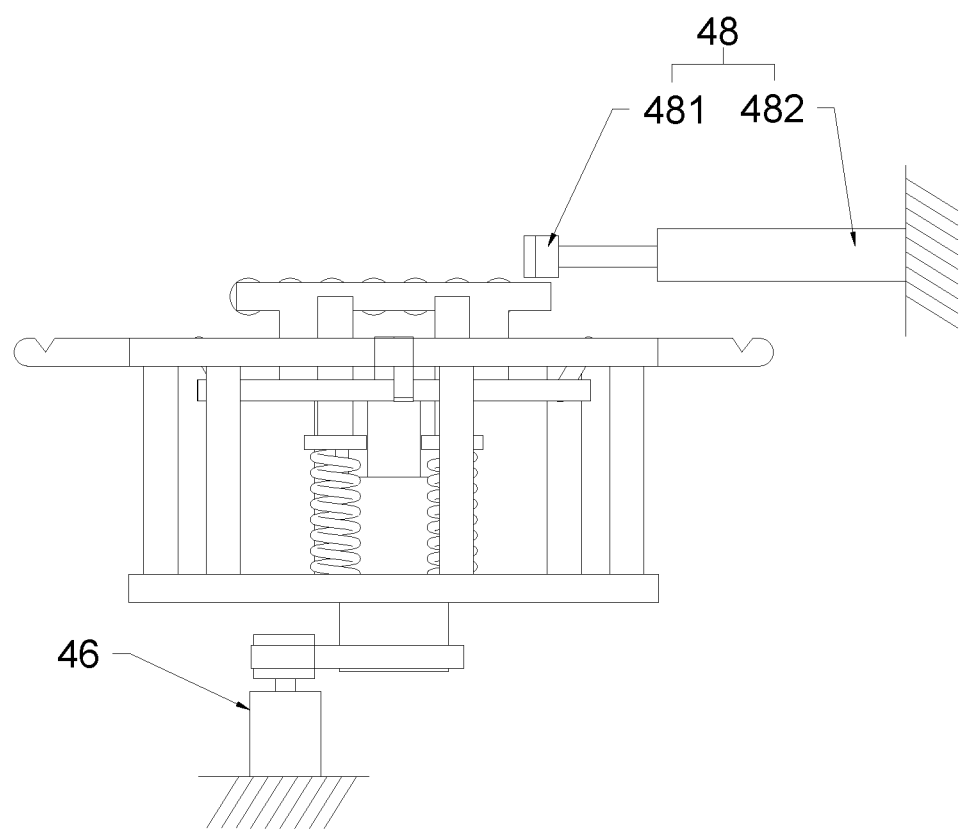
FIG. 4 is a schematic side-view structural diagram of a spin-drying device.
Figure 5:
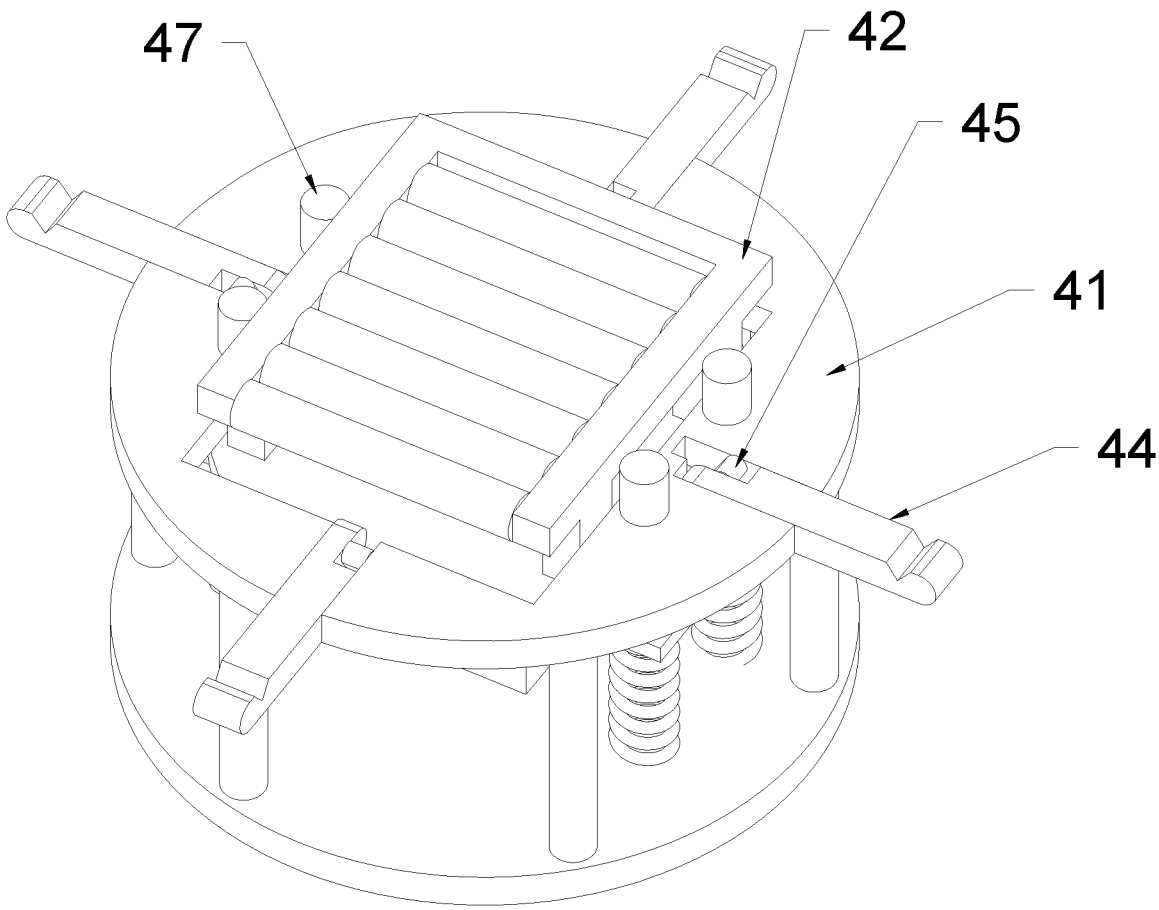
FIG. 5 is a schematic three-dimensional structural diagram of a spin-drying device.
Figure 6:
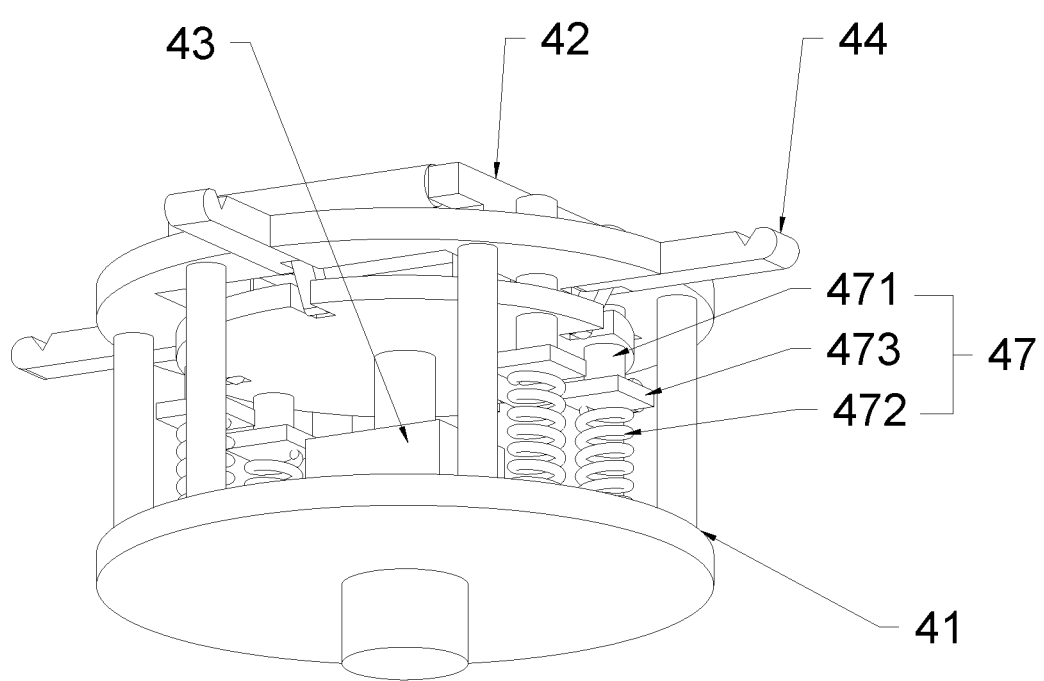
FIG. 6 is a schematic three-dimensional structural diagram of a spin-drying device taken from another angle.
Figure 7:
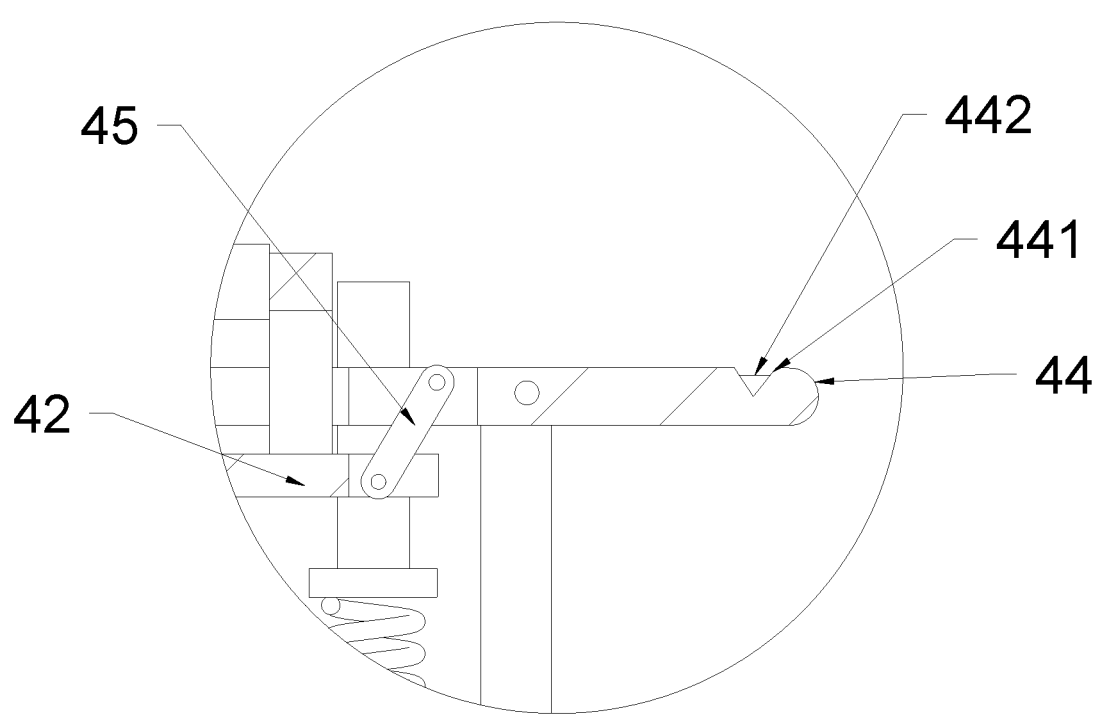
FIG. 7 is a schematic diagram of connection between a support base and a clamp finger.
Figure 8:
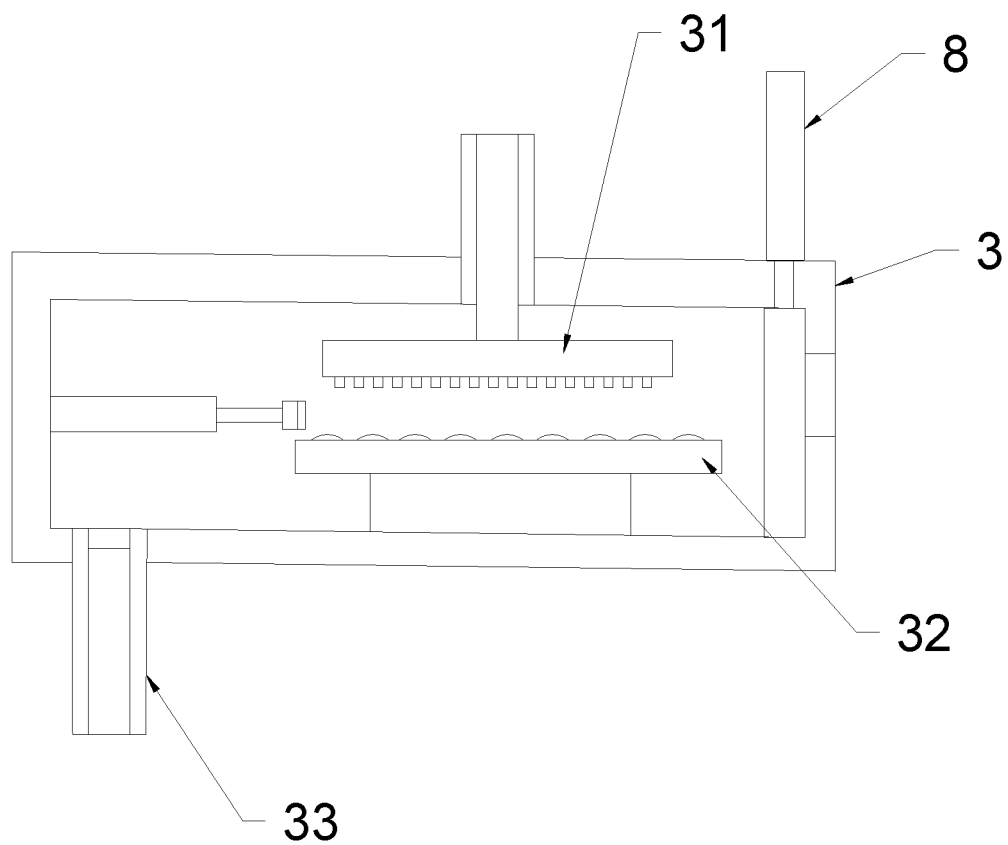
FIG. 8 is a schematic structural view of a cleaning chamber.
Figure 9:
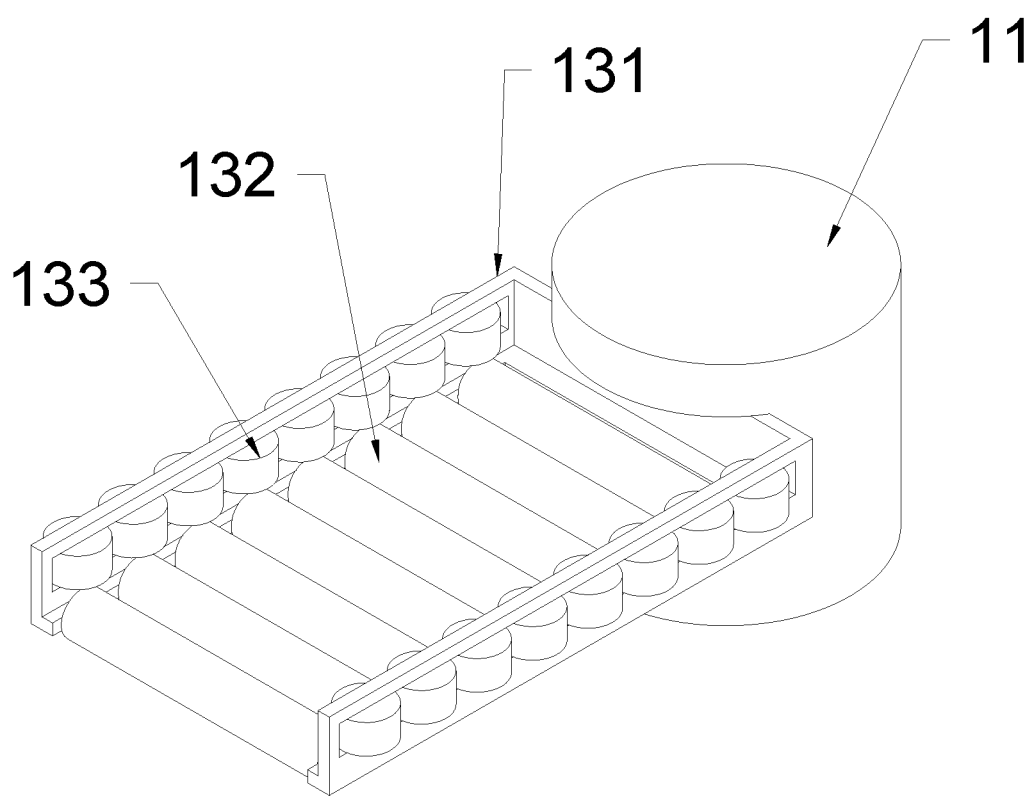
FIG. 9 is a schematic diagram of connection between a conveyor rod and conveyor assemblies.

More specifically, as illustrated in FIG. 3, a plurality of avoidance grooves 71 allowing the jack rods 471 to run through are arranged in the substrate tray 7, such that the jack rods 471 are capable of smoothly running through the substrate tray 7 to separate the substrates therein. Secondly, upon separation of the substrates, the jack rods 471 are capable of cooperating with the support base 42 to define the placement position of the substrate tray 7, such that the substrate tray 7 is prevented from being displaced or flying out during the rotation of the spin-drying support 41.

In some exemplary embodiments, a spray assembly 31 and a holder mechanism 32 configured to hold the substrate tray 7 are arranged within the cleaning chamber 3.

Specifically, the spray assembly 31 is configured to spray a cleaning solution to a top surface of the substrate on the substrate tray 7 to remove contaminants thereon; and the holder mechanism is a support structure configured to bear the substrate tray 7, wherein preferably a plurality of rollers 421 configured to bear the substrate tray 7 are also preferably arranged on a surface of the holder mechanism.

More specifically, a liquid discharge assembly 33 configured to discharge the cleaning solution is further arranged at a bottom of the cleaning chamber 3.

More specifically, the cleaning chamber 3 is further provided with a push mechanism 48 coincident with that in the spin-drying chamber 4, which is configured to limit the substrate tray 7 and complete fetching by the conveyor assemblies 13.

In some exemplary embodiments, each of the conveyor assemblies 13 includes a conveyor support 131 and a horizontal conveyor mechanism 132;

The conveyor support 131 is secured to the conveyor rod 11, and a conveyor channel facing the transfer chamber 1 is defined in the conveyor support 131.

The horizontal conveyor mechanism 132 is mounted on the conveyor channel, and is configured to push and receive the substrate tray 7.

Specifically, a flat edge is preferably defined on both sides of the substrate tray 7, and guide rollers 133 are rotatably mounted on an edge of the conveyor channel to define orientation of the substrate tray 7, such that the substrate tray 7 is ensured to be conveyed is conveyed in a specific orientation on the conveyor assemblies 13 and that each process is smoothly and accurately performed.

More specifically, the horizontal conveyor mechanism 132 may be one of a roller conveyor mechanism (a drive member not illustrated in the drawings), a linear push mechanism, or a pulley conveyor mechanism.

In some exemplary embodiments, a gate valve 8 is arranged on each of one sides, close to the transfer chamber 1, of the load lock 2, the cleaning chamber 3, the spin-drying chamber 4, the deposition chamber 5 and the unload lock 6.

Specifically, the gate valves 8 are capable of sealing the corresponding chambers, which avoids the problems that different chambers affect the environment of the transfer chamber 1 during operation, such as isolating the cleaning liquid from entering the transfer chamber 1 and preventing the spin-off chamber 4 from spinning the liquid into the transfer chamber 1.

In some exemplary embodiments, a wafer cassette 61 configured to the substrate tray 7 and a lift assembly 62 configured to adjust a height of the wafer cassette 61 are arranged in in both the load lock 2 and the unload lock 6.

Specifically, the lift assembly 62 is configured to adjust the height of the wafer cassette 61, such that the substrate trays 7 placed at different positions in the wafer cassette 61 in the load lock 2 are smoothly fed into the corresponding conveyor assemblies 13, and that the conveyor assemblies 13 are capable of feeding the substrate trays 7 upon deposition to different positions in the wafer cassette 61 in the unload lock 6.

More specifically, the load lock 2 is further provided with a push assembly configured to push the substrate in the wafer cassette 61 into the conveyor assembly 13, which may be the push mechanism 48 in the spin-drying chamber 4.

In some preferred embodiments, the screw drive mechanism 12 includes: a screw 121, a nut 122, and a rotary mechanism 123. The screw is securely connected to the conveyor rod 11. The nut 122 is threadedly connected to the screw 121, and is rotatably mounted at a bottom of the conveyor chamber 1. The rotary mechanism 123 is configured to drive the nut 122 to rotate.

Specifically, the screw 121 is sealingly connected to the transfer chamber 1 via a sealing bearing, and the nut 122 and the rotary mechanism 123 are arranged outside the transfer chamber 1, such that external gas is prevented from entering the apparatus and affecting the processing quality of the workpiece.

More specifically, the rotary mechanism 123 drives the nut 122 to rotate such that the screw 121 undergoes a spiral ascending or descending movement with respect to the transfer chamber 1, which in turn drives the conveyor rod 11 to undergo a spiral ascending or descending movement.

In the description of the present specification, reference terms such as "an embodiment," "some embodiments," "examples," "specific examples," "some examples," or the like are intended to refer to that the specific features, structures, materials, or characteristics which are described in combination with the embodiments or examples are included in at least one embodiment or example of the present disclosure. In this specification, schematic expressions of the above terms do not necessarily indicate the same embodiments or examples. In addition, the described specific features, structures, materials, or characteristics may be combined in any one or multiple embodiments or examples in a suitable way.

Described above are merely some exemplary embodiments of the present disclosure.

Persons of ordinary skill in the art may derive various variations and modifications without departing from the inventive concept of the present disclosure. Such variations and modifications shall pertain to the protection scope of the present disclosure.

What is claimed is:

1. A plasma enhanced chemical vapor deposition (PECVD) apparatus, comprising: a substrate tray, a transfer chamber, a load lock, a cleaning chamber, a spin-drying chamber, a deposition chamber, and an unload lock;

wherein the load lock, the cleaning chamber, the spin-drying chamber, the deposition chamber, and the unload lock are successively spirally arranged on a side wall of the transfer chamber;

a spiral conveyor device is arranged in the transfer chamber, wherein the spiral conveyor device comprises a conveyor rod, a spiral drive mechanism, and a plurality of conveyor assemblies;

wherein the conveyor rod is vertically arranged in the transfer chamber, and the plurality of conveyor assemblies are spirally arranged on the conveyor rod, and wherein the spiral drive mechanism is configured to drive the conveyor rod to undergo a spiral ascending or descending movement; and a spin-drying device is arranged in the spin-drying chamber, wherein the drying device comprises a drying support, and a support base, a lift mechanism, a plurality of clamp fingers, a connection rod, a rotation mechanism, and a jack mechanism;

wherein the support base is in lift connection to the spin-drying support, and is driven to ascend or descend by the lift mechanism to receive the substrate tray fed by the conveyor assemblies, wherein the plurality of clamp fingers are circumferentially arrayed on an outer side of the support base, and are hinged to the spin-drying support, wherein a bottom of the support base is hinged to one end of the each of the clamp fingers via the connection rod, wherein the rotation mechanism is arranged at a bottom of the spin-drying support, and is configured to drive the drying support to reciprocally rotate, wherein the jack mechanism is arranged on the spin-drying support, and is configured to jack to separate a substrate on the substrate tray, and wherein the jack mechanism comprises a plurality of jack assemblies, each of the jack assemblies comprising a jack rod, a jack elastic member, and a press plate, wherein the press plate is secured to a bottom of the jack rod, two ends of the jack elastic member are respectively securely connected to the spin-drying support and the press plate, and the support plate and the spin-drying support are both provided with a jack groove slidably engageable with the jack rod.

2. The PECVD apparatus according to claim 1, wherein a clamp groove is defined in the other end of the clamp finger, wherein an elastic member is arranged on the clamp groove.

3. The PECVD apparatus according to claim 1, wherein a plurality of rollers are rotatably connected to the support base, wherein a heating assembly is arranged in each of the rollers.

4. The PECVD apparatus according to claim 1, wherein a push mechanism is further arranged in the spin-drying chamber, wherein the push mechanism comprises a stop plate arranged on a side of the support base to define a feed position of the substrate tray and a push rod configured to drive the stop plate to undergo a horizontal displacement.

5. The PECVD apparatus according to claim 1, wherein a spray assembly and a holder mechanism configured to hold the substrate tray are arranged in the cleaning chamber.

6. The PECVD apparatus according to claim 1, wherein the conveyor assembly comprises a conveyor support and a horizontal conveyor mechanism; wherein
the conveyor support is secured to the conveyor rod, and a conveyor channel facing the transfer chamber is defined in the conveyor support; and
the horizontal conveyor mechanism is mounted on the conveyor channel, and is configured to push and receive the substrate tray.

7. The PECVD apparatus according to claim 1, wherein a gate valve is arranged on a side of each of the load lock, the cleaning chamber, the spin-drying chamber, the deposition chamber, and the unload lock.

8. The PECVD apparatus according to claim 1, wherein a wafer cassette configured to store the substrate tray and a lift assembly configured to adjust a height of the wafer cassette are arranged in both the load lock and the unload lock.

* * * * *